United States Patent
Elliott

(10) Patent No.: US 9,985,121 B1
(45) Date of Patent: May 29, 2018

(54) P-TYPE DIAMOND GATE-GAN HETEROJUNCTION FET STRUCTURE

(71) Applicant: HRL Laboratories, LLC, Malibu, CA (US)

(72) Inventor: Kenneth R. Elliott, Thousand Oaks, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days. days.

(21) Appl. No.: 15/096,259

(22) Filed: Apr. 11, 2016

Related U.S. Application Data

(60) Provisional application No. 62/146,950, filed on Apr. 13, 2015.

(51) Int. Cl.
| | |
|---|---|
| *H01L 29/778* | (2006.01) |
| *H01L 29/20* | (2006.01) |
| *H01L 29/205* | (2006.01) |
| *H01L 29/15* | (2006.01) |
| *H01L 29/43* | (2006.01) |
| *H01L 29/66* | (2006.01) |

(52) U.S. Cl.
CPC ........ *H01L 29/7784* (2013.01); *H01L 29/157* (2013.01); *H01L 29/2003* (2013.01); *H01L 29/205* (2013.01); *H01L 29/432* (2013.01); *H01L 29/66462* (2013.01)

(58) Field of Classification Search
CPC ......... H01L 29/66431; H01L 29/66462; H01L 29/778
See application file for complete search history.

(56) References Cited

U.S. PATENT DOCUMENTS

| | | | | |
|---|---|---|---|---|
| 2006/0108606 A1* | 5/2006 | Saxler | ............... | H01L 21/318 257/200 |
| 2006/0226442 A1* | 10/2006 | Zhang | ............... | H01L 29/7787 257/192 |
| 2009/0321854 A1* | 12/2009 | Ohta | ............... | H01L 27/0605 257/411 |
| 2011/0079771 A1* | 4/2011 | Kanamura | ............... | H01L 29/778 257/24 |
| 2013/0168687 A1* | 7/2013 | Kuo | ............... | H01L 29/2003 257/76 |
| 2013/0320952 A1* | 12/2013 | Rieger | ............... | H01L 29/778 323/311 |
| 2013/0334573 A1* | 12/2013 | Ostermaier | ............... | H01L 29/407 257/194 |

(Continued)

OTHER PUBLICATIONS

Anderson et al., "Nanocrystalline Diamond-Gated AlGaN/GaN HEMT" IEEE Electron Device Letters, vol. 34, No. 11, Nov. 2013, pp. 1382-1384.

(Continued)

*Primary Examiner* — Benjamin Sandvik
(74) *Attorney, Agent, or Firm* — Ladas & Parry

(57) ABSTRACT

A FET device includes a substrate having top and bottom surfaces, a channel layer on the top surface of the substrate; the channel layer having top and bottom surfaces, at least two recesses extending into the channel layer from the top surface of the channel layer and forming a channel region between the at least two recesses, a gate electrode disposed in each of the at least two recesses, and a drain region and a source region formed in the channel layer on opposite sides of said channel region.

30 Claims, 4 Drawing Sheets

(56) References Cited

U.S. PATENT DOCUMENTS

| | | | |
|---|---|---|---|
| 2014/0091366 A1* | 4/2014 | Jeon | H01L 21/8252 257/195 |
| 2015/0060947 A1* | 3/2015 | Koehler | H01L 29/267 257/194 |
| 2016/0049504 A1* | 2/2016 | Renaldo | H01L 29/7783 257/20 |

OTHER PUBLICATIONS

Im et al., "High-Performance GaN-Based Nanochannel FinFETs With/Without AlGaN/GaN Heterostructure" published in IEEE Transactions on Electron Devices, vol. 60, No. 10, Oct. 2013, pp. 3012-3018.

* cited by examiner

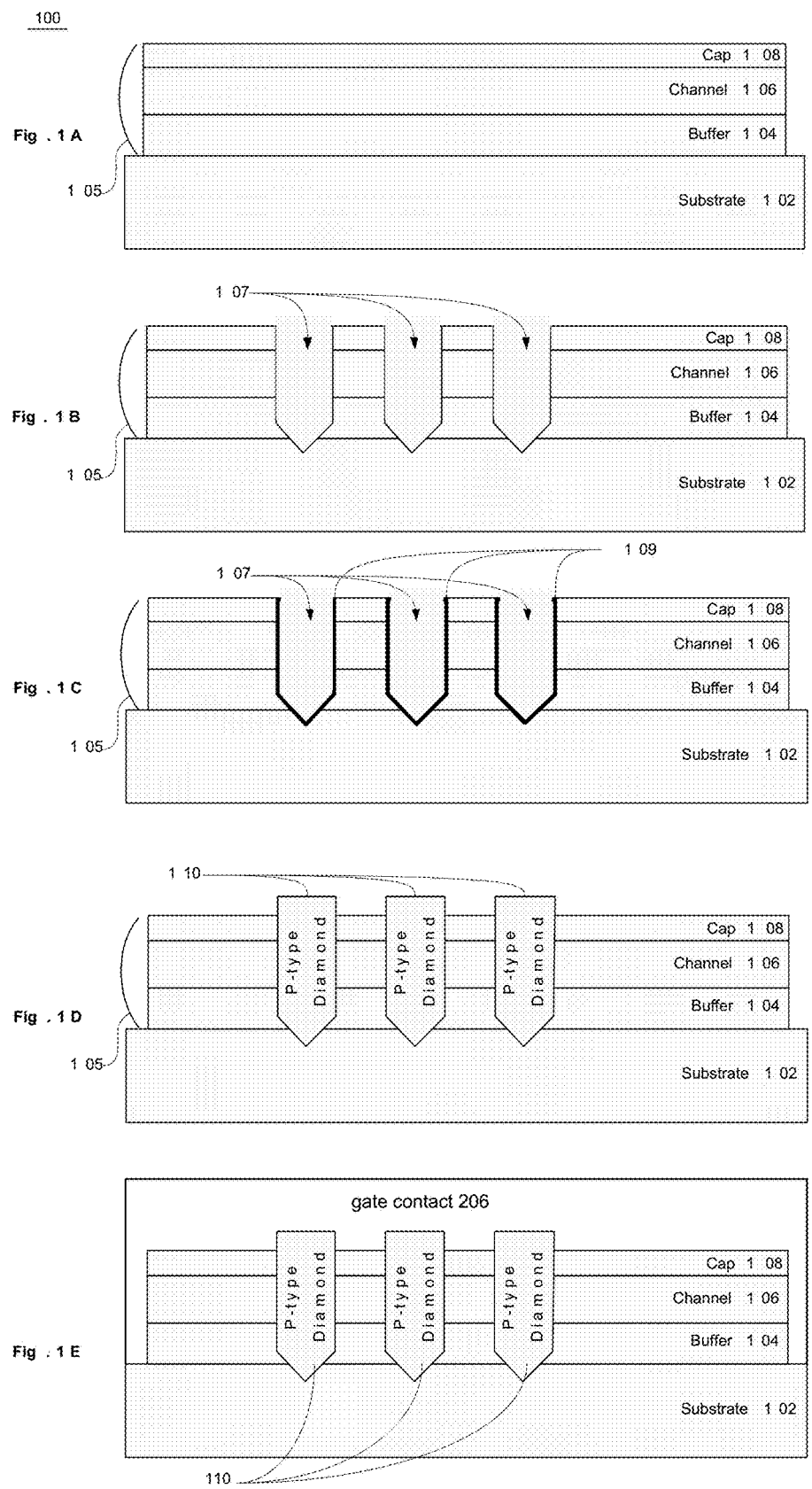

Conventional Structure

| $Al_{0.5}Ga_{0.5}N$ cap | 2.5 nm |
|---|---|
| AlN top barrier | 2.0 nm |
| GaN channel | 20 nm |
| $Al_{0.08}Ga_{0.92}N$ back barrier | |
| S.I. SiC substrate | |

| Superlattice structure | |
|---|---|
| $Al_{0.5}Ga_{0.5}N$ | 2.5 nm |
| AlN top barrier | 2.0 nm |
| GaN channel | 20 nm |
| $Al_{0.08}Ga_{0.92}N$ back barrier | |
| GaN channel | 20 nm |
| $Al_{0.08}Ga_{0.92}N$ back barrier | |
| GaN channel | 20 nm |
| $Al_{0.08}Ga_{0.92}N$ back barrier | |
| GaN channel | 20 nm |
| $Al_{0.08}Ga_{0.92}N$ back barrier | |
| S.I SiC substrate | |

Fig. 5

P-TYPE DIAMOND GATE-GAN HETEROJUNCTION FET STRUCTURE

CROSS REFERENCE TO RELATED APPLICATIONS

This application is related to and claims the benefit of priority of U.S. Provisional Patent Application No. 62/146,950, filed Apr. 13, 2015, which is incorporated herein by reference as though set forth in full.

BACKGROUND

Technical Field

The technology here presented relates to field effect transistors (FETs), and more particularly to a FET having a fin-shaped conducting channel.

Discussion of the Related Art

There are many industries which can benefit from high power density and high gain semiconductor transistors. For example, potential applications may include phased array, cell-phone, or base station power amplifier applications.

P-type diamond and p-type SiC are wide band-gap semiconductors that can be grown with sufficient conductivity for the gate conductor of a GaN or AlGaN-based field effect transistor. Prior research has shown that they can be used as a gate for a heterojunction field effect transistor. This research has identified benefits of a p-type diamond gate for GaN technology with a metal-insulator-semiconductor (MIS)-like AlGaN barrier.

Known devices with diamond gates, described above, are limited due to the difficulty of growing diamond on the respective materials with sufficiently low stress and low enough conductivity. Further, the stress is known to become larger as the lateral dimensions of the material are increased. In addition, the field from the gate material extends vertically from the gate into the semiconductor material. This geometry limits the thickness of the conducting layer structure to dimensions of approximately 20 nm and the sheet charge to approximately $1 \times 10^{13}$ cm$^{-2}$. The paper "Nanocrystalline Diamond-Gated AlGaN/GaN HEMT" IEEE Electron Device Letters, Vol. 34, No. 11, November 2013 describes benefits of p-type diamond gate on GaN technology; however, the technology described has less than a desirable high power density and gain.

A structure which has a higher power density and gain, while reducing stress during fabrication, is desirable.

SUMMARY

A FinFET version of a heterojunction field effect transistor (HFET) can be scaled to higher power density and gain than a conventional GaN-based HFET. A regrown FinFET structure according to various embodiments may have a higher power density and gain with reduced stress as compared to the existing art.

Various embodiments use a fully planar geometry for reduced access resistance and a higher forward gate bias due to the greater built-in potential as compared to devices according to the existing art. In some embodiments, the FinFET geometry uses multiple nm-scale diamond gate structures that are lower stress due to the reduced size. Due to the small size of p-type diamond gates, substantial lattice mismatch is tolerable. An additional advantage of the FinFET geometry can be the reduction in short channel effects at reduced channel length. This reduction is expected to provide greater output resistance than that obtained with the existing art for similar performance.

In some embodiments, a FinFET includes a substrate and an epitaxial stack formed atop the substrate. The epitaxial stack has a buffer layer formed atop the substrate, a channel layer of a wide band-gap material formed atop the buffer layer and a cap layer formed atop the channel layer. A plurality of recesses are formed through the cap layer and contacting the channel layer. The recesses may be arranged in a row across the epitaxial stack. A plurality of conducting wide band-gap material gate electrodes are grown in corresponding ones of the plurality of recesses. A conducting layer is fabricated atop the plurality of gate electrodes to form a gate contact. A source contact contacting the channel layer is applied on one side of the line formed by the plurality of gate electrodes and a drain contact contacting the channel layer is applied on the other side of the line formed by the plurality of gate electrodes.

A FinFET according to some embodiments enables lower access resistance, greater sheet charge and higher current gain than previously demonstrated GaN-based n-channel HFET devices. A diamond gate in a FinFET with this geometry offers a substantial benefit compared to other FinFET structures due to the improved thermal conductivity of diamond and larger built-in potential of the heterojunction over most alloy semiconductors. Such a FinFET structure is scalable to smaller geometries and has higher maximum available gain than the known structures described above.

More specifically, based on the known structures described above, the expected sheet charge is greater than $1 \times 10^{14}$ cm$^{-2}$ for a three layer structure for some embodiments, as compared to about $1 \times 10^{13}$ cm$^{-2}$ for a typical HEMT single layer device structure.

The geometry according to various embodiments permits high quality GaN transistors. The structure is relatively insensitive to the structural quality of the diamond gate material.

In one embodiment disclosed herein, a FET device comprises a substrate having top and bottom surfaces, a channel layer on the top surface of the substrate, the channel layer having top and bottom surfaces, at least two recesses extending into the channel layer from the top surface of the channel layer and forming a channel region between the at least two recesses, a gate electrode disposed in each of the at least two recesses, and a drain region and a source region formed in the channel layer on opposite sides of said channel region.

In another embodiment disclosed herein, a method of fabricating a FET device comprises forming a substrate having top and bottom surfaces, forming a channel layer on the top surface of the substrate, the channel layer having top and bottom surfaces, forming at least two recesses extending into the channel layer from the top surface of the channel layer, thus forming a channel region between the at least two recesses and forming a drain region and a source region in the channel layer on opposite sides of said channel region, and forming a gate electrode in each of the at least two recesses.

These and other features and advantages will become further apparent from the detailed description and accompanying figures that follow. In the figures and description, numerals indicate the various features, like numerals referring to like features throughout both the drawings and the description.

BRIEF DESCRIPTION OF THE DRAWINGS

FIG. 1A, FIG. 1B, FIG. 1C, FIG. 1D and FIG. 1E are cross-sectional diagrams illustrating a process flow for fabricating a p-type diamond/GaN heterojunction FET according to principles of the present technology;

FIG. 5 is a table listing the layers of a superlattice structure.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

The structure of a FET according to the present technology is described by the process flow set forth in the following portion of the present application. The present technology discloses fabricating the FET using a fully planar geometry for reduced access resistance and to support a higher forward gate bias due to the greater built-in potential as compared to known devices described above.

Figure 2A:
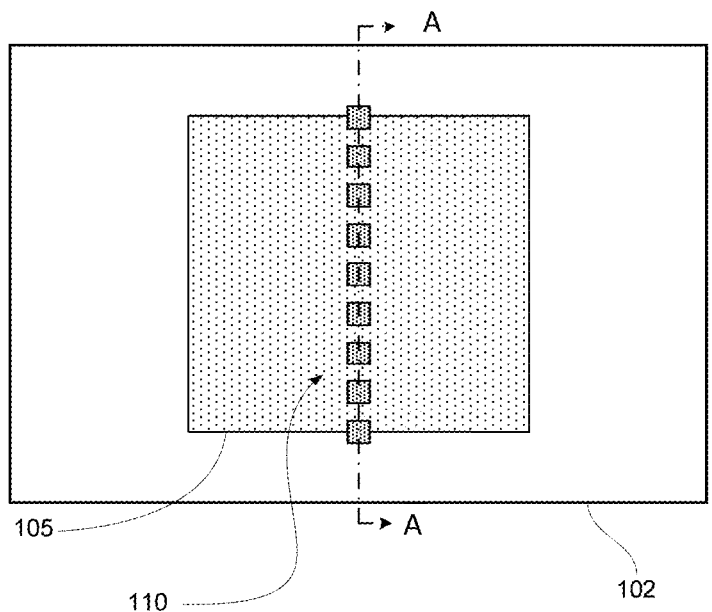
FIG. 2A and FIG. 2B are top view or plan diagrams illustrating further process flow, after source/drain etch and contact metal, for fabricating a FET according to principles of the present technology.
Figure 2B:
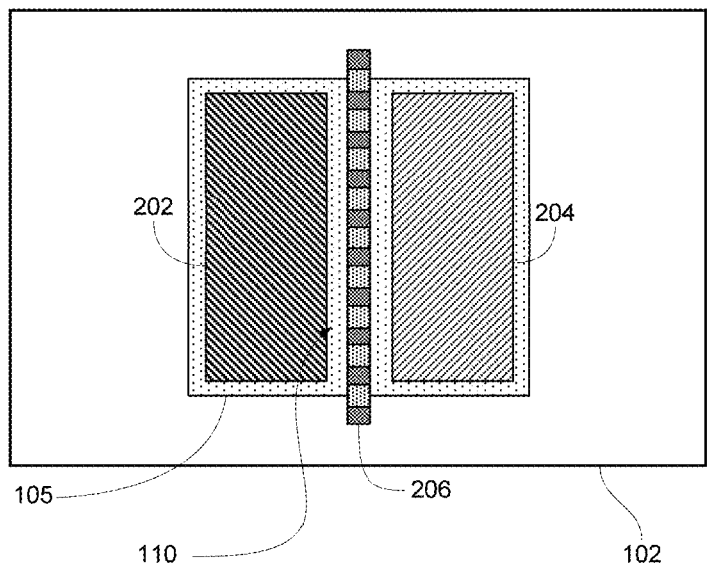

FIG. 1A, FIG. 1B, FIG. 1C, FIG. 1D and FIG. 1E are cross-sectional diagrams illustrating a process flow for fabricating a p-type diamond/GaN heterojunction FET 100, and FIG. 2A and FIG. 2B are top view or plan diagrams illustrating further process flow, after source/drain etch and contact metal, for fabricating a FET 100. FIGS. 1A, 1B, 1C, 1D and 1E illustrate cross sectional views of the FET 100 along the cross-section A-A of FIG. 2A. Some embodiments may be more easily understood by concurrent reference to both FIGS. 1A, 1B, 1C, 1D and 1E and FIGS. 2A and 2B. The steps for a nominal embodiment include the following.

In FIG. 1A, growth of the starting material is a conventional n-type AlGaN/GaN epitaxial (epi) stack structure 105. This stack 105 is electrically isolated from other devices by either defining a mesa or using some other method, such as ion bombardment. In FIG. 1A, substrate 102 is a semi-insulating substrate consisting of silicon-carbide (SiC) or other suitable material for growing a high quality epi stack 105. The substrate 102 has a buffer layer 104 consisting of an $Al_{0.08}Ga_{0.92}N$ layer epitaxially formed on the substrate 102 and having a thickness determined in a manner known to one skilled in the art. The buffer layer 104 operates as a back barrier, electrically isolating the epi stack 105 from the substrate 102. A GaN channel layer 106 is grown atop the buffer layer 104. The thickness of the GaN channel layer 106 is typically about 20 nm. A cap layer 108 is grown atop the GaN channel layer 106, and may be composed of $Al_{0.5}Ga_{0.5}N$. The thickness of the $Al_{0.5}Ga_{0.5}N$ layer is typically about 2.5 nm. These layers may be formed using existing techniques known to one skilled in the art, for example using molecular beam epitaxy (MBE), metal organic vapor phase epitaxy (MOCVD) or other existing growth methods.

Figures 3, 4:
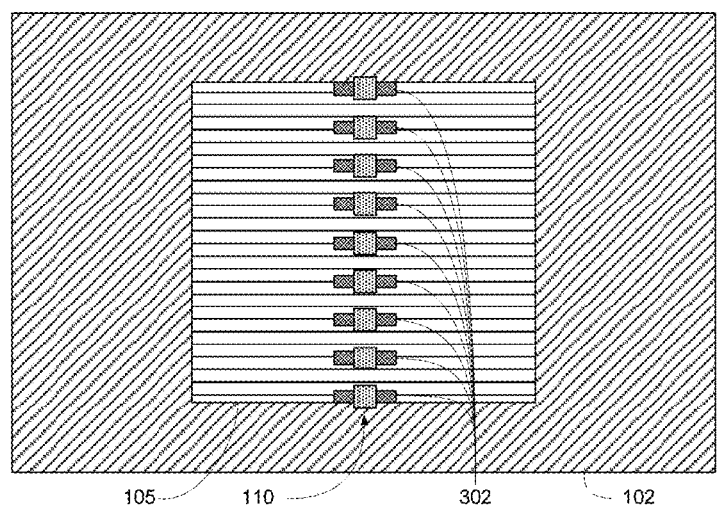
FIG. 3 is a plan diagram illustrating an optional process flow step for fabricating a FET according to principles of the present technology.
FIG. 4 is a table listing the layers of a conventional structure.

FIG. 4 is a table listing layers of a layer structure that may be used in some embodiments. In such a structure, other layers may be fabricated in addition to the epi stack layers 105 illustrated in FIG. 1A. For example, an AlN top layer (not shown to simplify the figure) may be formed between the GaN channel 106 and the cap layer 108. The thickness of the top layer may typically be about 2.0 nm, although it may be larger or smaller in other embodiments. In an alternative embodiment, epi stack 105 may comprise a superlattice stack or a similar stack on an alternative substrate. FIG. 5 is a table listing the layers of a superlattice structure. Again, in such a structure other layers may be fabricated in addition to the epi stack layers 105 illustrated in FIG. 1A. InGaN may also be used as an alternative to GaN. The contents of such layer stacks are common in the published literature.

In FIG. 1B, two or more recesses 107 are then etched into the epi stack 105 at a regular spacing of approximately one to two depletion lengths for the GaN/diamond heterojunction. These may be formed by using existing chlorine-based dry reactive-ion etching (RIE) methods and equipment. The depth of the etch is determined by the depth of the total epitaxial stack or about 25 nm for the conventional layer structure (FIG. 4) or 100 nm or greater for the superlattice layer structure (FIG. 5). A limit to the thickness is determined by the ability to maintain a vertically uniform cross section for the etched recesses. The cross section shape is designed for optimal deposition of the diamond material without voids. For some embodiments, a typical center-to-center pitch is on the order of 200 nm for a nominal gate length of 100 nm. For other embodiments, the center-to-center pitch may range between 20 nm to 400 nm. The plurality of recesses 107 form a line traversing the middle of the epi stack 105. They are etched to a depth through the epitaxial stack and through each of the conductive GaN layers. In some embodiments, the recesses 107 are etched across the width of the source-drain channel formed by the epi stack 105, and act as a template for gate electrodes in the FET.

Referring to FIG. 1C, optionally, a thin AlGaN passivation layer 109 may be grown in the recesses 107 at this point, prior to gate deposition, to passivate and further isolate the GaN channel 106 from gate electrodes 110, and to limit conduction in forward bias. The passivation layer 109 may be formed on the sidewalls of recesses 107. This layer may be formed using methods such as atomic layer deposition (ALD), MBE, or MOCVD. A nominal thickness of the passivation layer may be about 10 nm or less. The passivation layer 109 is not shown in the remainder of FIG. 1.

In FIG. 1D, wide band-gap conducting material gate electrodes are then formed in the etched recesses 107. Preferably, boron-doped diamond gate electrodes 110 are formed by gate regrowth in the etched recesses 107. However, boron-doped silicon carbide may also be used as the gate electrodes 110. Diamond nanocrystals are nucleated in the recesses 107 etched in the material during the step illustrated in FIG. 1B. Diamond is known to prefer to nucleate along scratches and defects. Diamond growth is expected to occur under these and similar conditions.

In a further embodiment, as shown in FIG. 1E, a conducting layer is formed atop the epitaxial stack, connecting the plurality of gate electrodes to form a gate contact 206.

Referring now to FIG. 2A, the top of a row of gate electrodes 110 are illustrated as running across the width of the epi stack 105 atop the substrate 102. In FIG. 2B, source and drain contact locations are etched through the cap layer 108, and into the channel layer 106 in the epi stack 105. Contact metal is fabricated in the etched locations to form a source contact 202 and a drain contact 204, respectively. A contact metal known to form an ohmic contact with GaN/AlGaN FETs is used to form the drain and source contacts, such as Ti/Al-based ohmic contacts or Ti/Pt on top of regrown GaN. A metal such as gold is fabricated atop the diamond gate electrodes 110 and used to form an ohmic contact with the diamond gate electrodes 110 to form a gate contact 206.

FIG. 3 is a plan diagram illustrating an optional process flow step for fabricating a FET 100 according to principles of the present technology. Optionally, a step illustrated in FIG. 3 produces a plurality of isolation depressions 302 to reduce gate-drain and/or gate-source capacitance. The isolation depressions 302 may extend in a direction that is perpendicular to the row of gate electrodes 110, and the isolation depressions 302 may be formed on both sides of the row of gate electrodes 110. These isolation depressions 302 may be formed by etching, or by ion bombardment. In a preferred embodiment, the same type of etch is used as described above, i.e. a Cl-based Reactive Ion Etching (RIE). The etch is masked using standard lithographic resist processes.

GaN-based power semiconductor device technology benefits from the FET approach described above with respect to several embodiments.

Concepts

This writing discloses at least the following Concepts.

Concept 1. A FinFET device comprising:
a substrate;
an epitaxial stack formed atop the substrate, comprising:
a buffer layer formed atop the substrate;
a channel layer of a wide band-gap material formed atop the buffer layer; and
a cap layer formed atop the channel layer;
a plurality of gate electrodes that extend within the channel layer, the plurality of gate electrodes being arranged in a row;
a conducting layer connecting the plurality of gate electrodes to form a gate contact;
a source contact contacting the channel layer on one side of the row formed by the plurality of gate electrodes; and
a drain contact contacting the channel layer on the other side of the row formed by the plurality of gate electrodes.

Concept 2. The device of concept 1, wherein the substrate comprises a semi-insulating SiC substrate.

Concept 3. The device of concept 1 wherein the buffer layer comprises $Al_{0.08}Ga_{0.92}N$.

Concept 4. The device of concept 1, wherein the channel layer has a thickness of substantially 20 nm.

Concept 5. The device of concept 1, wherein the channel layer comprises a superlattice channel layer.

Concept 6. The device of concept 5, wherein the channel layer has a thickness of substantially 100 nm.

Concept 7. The device of concept 4, wherein the channel layer comprises GaN.

Concept 8. The device of concept 4, wherein the channel layer comprises InGaN.

Concept 9. The device of concept 1 wherein the cap layer has a thickness of substantially 2.5 nm.

Concept 10. The device of concept 9 wherein the cap layer comprises $Al_{0.5}Ga_{0.5}N$.

Concept 11. The device of concept 1, wherein the material forming the plurality of gate electrodes is boron-doped diamond.

Concept 12. The device of concept 1, wherein the material forming the plurality of gate electrodes is boron-doped silicon carbide.

Concept 13. The device of concept 1, further comprising a regrown AlGaN passivation layer formed in the channel layer around the gate electrodes.

Concept 14. The device of concept 1, wherein the gate electrodes are spaced from one to two depletion lengths for the heterojunction of the substrate and gate electrode materials.

Concept 15. The device of concept 14, wherein the gate electrode pitch is about 200 nm.

Concept 16. The device of concept 14, wherein the gate electrodes pass through the epitaxial stack.

Concept 17. The device of concept 1 wherein the conducting layer forming the gate contact is gold.

Concept 18. The device of concept 1 further comprising a corresponding plurality of isolation depressions formed on the epitaxial stack abutting the gate electrodes, and extend in a direction perpendicular to the row of gate electrodes.

Concept 19. The device of concept 18 wherein the isolation depressions are formed by etching.

Concept 20. The device of concept 18 wherein the isolation depressions are formed by ion bombardment.

Concept 21. The device of concept 1 further comprising:
a plurality of recesses through the channel layer, arranged in a row traversing the epitaxial stack.

Concept 22. The device of concept 1, wherein the material forming the plurality of gate electrodes is a wide bandgap material.

Concept 22. A GaN FinFET device comprising:
a SiC semi-insulating substrate;
an epitaxial stack formed atop the substrate, comprising:
an $Al_{0.08}Ga_{0.92}N$ buffer layer, operating as a back barrier, formed atop the substrate;
a GaN channel layer having a thickness of substantially 20 nm formed atop the buffer layer; and
an $Al_{0.5}Ga_{0.5}N$ cap layer having a thickness of substantially 2.5 nm formed atop the channel layer;
a plurality of recesses through the epitaxial stack arranged in a line traversing the middle of the epitaxial stack, spaced by about one to two depletion lengths for the GaN/diamond heterojunction and having an AlGaN passivation layer grown on the sidewalls;
a corresponding plurality of boron-doped diamond gate electrodes grown in the plurality of recesses;
a corresponding plurality of isolation depressions etched around the gate electrodes;
a gold conducting layer fabricated atop the plurality of gate electrodes to form a gate contact;
a source contact contacting the channel layer on one side of the line formed by the plurality of gate electrodes; and
a drain contact contacting the channel layer on the other side of the line formed by the plurality of gate electrodes.

Concept 23. A method of forming a FinFET device, the method comprising:
forming a substrate;
forming an epitaxial stack atop the substrate, the epitaxial stack comprising:
a buffer layer formed atop the substrate;
a channel layer of a wide band-gap material formed atop the buffer layer; and
a cap layer formed atop the channel layer;
forming a plurality of gate electrodes that extend within the channel layer, the plurality of gate electrodes being arranged in a row;
forming a conducting layer connecting the plurality of gate electrodes to create a gate contact;
forming a source contact contacting the channel layer on one side of the row of gate electrodes; and forming a drain contact contacting the channel layer on the other side of the row of gate electrodes.

Concept 24. A HFET device comprising:
a substrate having top and bottom surfaces;
a channel layer on the top surface of the substrate; the channel layer having top and bottom surfaces;
at least two recesses extending into the channel layer from the top surface of the channel layer and forming a channel region between the at least two recesses;
a gate electrode disposed in each of the at least two recesses; and
a drain region and a source region formed in the channel layer on opposite sides of said channel region.

Concept 25. The HFET device of concept 24, wherein the channel region extends from the top surface to the bottom surface of the channel layer.

Concept 26. The HFET device of concept 24, wherein a conductor is arranged above the channel layer and connects the gate electrodes disposed within each of the at least two recesses to form a single gate electrode.

Concept 27. The HFET device of concept 26, wherein the channel layer material is a wide bandgap material and the substrate is an insulator substrate.

Concept 28. The HFET device of concept 27, wherein the channel layer comprises a III-N material and the gate electrode comprises a high bandgap material.

Concept 29. The HFET device of concept 28, wherein the at least two recesses are distant from each other by at most two depletion lengths for the materials in the channel layer and in the at least two recesses.

Concept 30. The HFET device of concept 28, wherein the gate electrode comprises one of Boron-doped Nano Crystalline Diamond (NCD) and Boron-doped SiC.

Concept 31. The HFET device of concept 30, wherein the channel layer is separated from the gate electrode by a capping layer.

Concept 32. The HFET device of concept 31, wherein the channel layer is separated from the substrate by a buffer layer; the junction of the buffer layer and the channel layer forming a heterojunction.

Concept 33. The HFET device of concept 32, wherein the channel layer and buffer layer form part of a superlattice structure comprising at least one additional channel layer arranged below the buffer layer and an additional buffer layer arranged between the at least one additional channel layer and the substrate.

Concept 34. The HFET device of concept 33, wherein the at least two recesses pass through the channel layer and the at least one additional channel layer.

Concept 35. The HFET device of concept 32, wherein the channel layer comprises one of GaN and InGaN.

Concept 36. The HFET device of concept 35, wherein the capping layer comprises an AlGaN layer.

Concept 37. The HFET device of concept 36, wherein the capping layer comprises an AlN barrier layer between its AlGaN layer and the channel layer.

Concept 38. The HFET device of concept 36, wherein the substrate is SiC.

Concept 39. The HFET device of concept 23, comprising insulating regions along the walls of the at least two recesses, between the at least two recesses and the source and drain regions.

Concept 40. The HFET device of concept 39, wherein said insulating regions comprise recesses etched in the channel layer.

Concept 41. The HFET device of concept 39, wherein said insulating regions comprise ion implanted regions.

Concept 42. The HFET device of concept 23, comprising Ohmic contacts to the source and drain regions.

Concept 43. A method of fabricating a HFET device comprising:
forming a substrate having top and bottom surfaces;
forming a channel layer on the top surface of the substrate; the channel layer having top and bottom surfaces;
forming at least two recesses extending into the channel layer from the top surface of the channel layer, thus forming a channel region between the at least two recesses and forming a drain region and a source region in the channel layer on opposite sides of said channel region; and
forming a gate electrode in each of the at least two recesses.

Concept 44. The method of concept 43, wherein the channel region extends from the top surface to the bottom surface of the channel layer.

Concept 45. The method of concept 43, comprising arranging a conductor above the channel layer so as to connect the conductor material in the at least two recesses to form a single gate electrode.

Concept 46. The method of concept 45, wherein the channel layer material is a wide bandgap material and the substrate is an insulator substrate.

Concept 47. The method of concept 46, wherein the channel layer comprises a III-N material and the gate electrode comprises a high bandgap material.

Concept 48. The method of concept 47, comprising forming the at least two recesses at a distance from each other of at most two depletion lengths for the materials in the channel layer and in the at least two recesses.

Concept 49. The method of concept 47, wherein the gate electrode comprises one of Boron-doped Nano Crystalline Diamond (NCD) and Boron-doped SiC.

Concept 50. The method of concept 49, comprising growing a capping layer to separate the channel layer from the gate electrode.

Concept 51. The method of concept 50, comprising growing a buffer layer on the substrate prior to growing the channel layer on the buffer layer; the junction of the buffer layer and the channel layer forming a heterojunction.

Concept 52. The method of concept 51, wherein the channel layer and buffer layer form part of a superlattice structure, the method comprising forming at least one additional channel layer arranged below the buffer layer and an additional buffer layer arranged between the at least one additional channel layer and the substrate.

Concept 53. The method of concept 52, comprising forming the at least two recesses through the channel layer and through the at least one additional channel layer.

Concept 54. The method of concept 51, wherein the channel layer comprises one of GaN and InGaN.

Concept 55. The method of concept 53, wherein the capping layer comprises an AlGaN layer.

Concept 56. The method of concept 56, wherein the capping layer comprises an AlN barrier layer between its AlGaN layer and the channel layer.

Concept 57. The method of concept 56, wherein the substrate is SiC.

Concept 58. The method of concept 43, comprising forming insulating regions along the walls of the at least two recesses, between the at least two recesses and the source and drain regions.

Concept 59. The method of concept 58, comprising forming said insulating regions by etching recesses in the channel layer.

Concept 60. The method of concept 58, comprising forming said insulating regions by ion implantation.

Concept 61. The method of concept 43, comprising forming Ohmic contacts to the source and drain regions.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

Broadly, this writing discloses at least a FET that includes a substrate and an epitaxial stack formed atop the substrate. The epitaxial stack has a buffer layer formed atop the substrate, a channel layer of a wide band-gap material formed atop the buffer layer and a cap layer formed atop the channel layer. A plurality of recesses are formed through the cap layer and contacting the channel layer. The recesses are arranged in a line traversing the middle of the epitaxial stack. A plurality of conducting wide band-gap material gate electrodes are grown in corresponding ones of the plurality of recesses. A conducting layer is fabricated atop the plurality of gate electrodes to form a gate contact. A source contact contacting the channel layer is applied on one side of the line formed by the plurality of gate electrodes and a drain contact contacting the channel layer is applied on the other side of the line formed by the plurality of gate electrodes.

What is claimed is:

1. A FET device comprising:
   a substrate having top and bottom surfaces;
   a channel layer on the top surface of the substrate, the channel layer having top and bottom surfaces;
   at least two recesses extending into the channel layer from the top surface of the channel layer, extending through the bottom surface of the channel layer, and forming a channel region between the at least two recesses;
   a gate electrode disposed in each of the at least two recesses; and
   a drain region and a source region formed in the channel layer on opposite sides of said channel region;
   wherein each gate electrode comprises a p-type diamond gate.

2. The FET device of claim 1, wherein the channel region extends from the top surface to the bottom surface of the channel layer.

3. The FET device of claim 1, wherein a conductor is arranged above the channel layer and connects the gate electrodes disposed within each of the at least two recesses to form a single gate electrode.

4. The FET device of claim 1:
   wherein the channel layer material comprises a wide bandgap material or comprises a III-N material.

5. The FET device of claim 4, wherein the at least two recesses are distant from each other by at most two depletion lengths for the materials in the channel layer and in the at least two recesses.

6. The FET device of claim 1, wherein the channel layer is separated from the gate electrode by a capping layer.

7. The FET device of claim 1:
   wherein the channel layer is separated from the substrate by a buffer layer; and
   wherein the junction of the buffer layer and the channel layer forms a heterojunction.

8. The FET device of claim 7, wherein the channel layer and buffer layer form part of a superlattice structure comprising at least one additional channel layer arranged below the buffer layer and an additional buffer layer arranged between the at least one additional channel layer and the substrate.

9. The FET device of claim 8, wherein the at least two recesses pass through the channel layer and the at least one additional channel layer.

10. The FET device of claim 6:
    wherein the channel layer comprises one of GaN and InGaN;
    wherein the capping layer comprises an AlGaN layer, or wherein the capping layer comprises an AlGaN layer and an AlN barrier layer between the AlGaN layer and the channel layer; and
    wherein the substrate is SiC.

11. The FET device of claim 1, comprising insulating regions along the walls of the at least two recesses, between the at least two recesses and the source and drain regions.

12. The FET device of claim 11:
    wherein said insulating regions comprise recesses etched in the channel layer, or wherein said insulating regions comprise ion implanted regions.

13. The FET device of claim 1, comprising Ohmic contacts to the source and drain regions.

14. The FET device of claim 1 further comprising:
    a barrier layer on the top surface of the channel layer;
    wherein the at least two recesses extend through the barrier layer.

15. The FET device of claim 7:
    wherein the at least two recesses extend through the buffer layer and into the substrate.

16. The FET device of claim 1 wherein each p-type diamond gate comprises Boron-doped Nano Crystalline Diamond (NCD).

17. A method of fabricating a FET device comprising:
forming a substrate having top and bottom surfaces;
forming a channel layer on the top surface of the substrate, the channel layer having top and bottom surfaces;
forming at least two recesses extending into the channel layer from the top surface of the channel layer and extending through the bottom surface of the channel layer, thus forming a channel region between the at least two recesses and forming a drain region and a source region in the channel layer on opposite sides of said channel region; and
forming a gate electrode in each of the at least two recesses;
wherein each gate electrode comprises a p-type diamond gate.

18. The method of claim 17, wherein the channel region extends from the top surface to the bottom surface of the channel layer.

19. The method of claim 17, comprising arranging a conductor above the channel layer so as to connect the conductor material in the at least two recesses to form a single gate electrode.

20. The method of claim 17:
wherein the channel layer material comprises a wide bandgap material or comprises a III-N material.

21. The method of claim 20, comprising forming the at least two recesses at a distance from each other of at most two depletion lengths for the materials in the channel layer and in the at least two recesses.

22. The method of claim 17, comprising growing a capping layer to separate the channel layer from the gate electrode.

23. The method of claim 17, comprising growing a buffer layer on the substrate prior to growing the channel layer on the buffer layer; the junction of the buffer layer and the channel layer forming a heterojunction.

24. The method of claim 23, wherein the channel layer and buffer layer form part of a superlattice structure, the method comprising forming at least one additional channel layer arranged below the buffer layer and an additional buffer layer arranged between the at least one additional channel layer and the substrate.

25. The method of claim 24, comprising forming the at least two recesses through the channel layer and through the at least one additional channel layer.

26. The method of claim 22:
wherein the channel layer comprises one of GaN and InGaN;
wherein the capping layer comprises an AlGaN layer, or wherein the capping layer comprises an AlGaN layer and an AlN barrier layer between the AlGaN layer and the channel layer; and
wherein the substrate is SiC.

27. The method of claim 17, comprising:
forming insulating regions along the walls of the at least two recesses, between the at least two recesses and the source and drain regions;
wherein forming said insulating regions comprises etching recesses in the channel layer or forming said insulating regions comprises ion implantation.

28. The method of claim 17 further comprising:
forming a barrier layer on the top surface of the channel layer;
wherein the at least two recesses extend through the barrier layer.

29. The method of claim 23:
wherein the at least two recesses extend through the buffer layer and into the substrate.

30. The method of claim 17 wherein each p-type diamond gate comprises Boron-doped Nano Crystalline Diamond (NCD).

* * * * *